(12) United States Patent
Li et al.

(10) Patent No.: US 11,335,605 B2
(45) Date of Patent: May 17, 2022

(54) STRAINED SEMICONDUCTOR DEVICE WITH IMPROVED NBTI AND A METHOD OF MAKING THE SAME

(71) Applicant: SHANGHAI HUALI INTEGRATED CIRCUIT CORPORATION, Shanghai (CN)

(72) Inventors: Runling Li, Shanghai (CN); Yanwei Zhang, Shanghai (CN)

(73) Assignee: SHANGHAI HUALI INTEGRATED CIRCUIT CORPORATION, Shanghai (CN)

(*) Notice: Subject to any disclaimer, the term of this patent is extended or adjusted under 35 U.S.C. 154(b) by 0 days.

(21) Appl. No.: 16/856,981

(22) Filed: Apr. 23, 2020

(65) Prior Publication Data

US 2021/0159125 A1 May 27, 2021

(30) Foreign Application Priority Data

Nov. 25, 2019 (CN) .......................... 201911163029.0

(51) Int. Cl.
*H01L 21/8238* (2006.01)
*H01L 27/092* (2006.01)
*H01L 29/49* (2006.01)
*H01L 29/78* (2006.01)

(52) U.S. Cl.
CPC ............... *H01L 21/823857* (2013.01); *H01L 21/823842* (2013.01); *H01L 27/092* (2013.01); *H01L 29/4975* (2013.01); *H01L 29/7842* (2013.01)

(58) Field of Classification Search
CPC ..... H01L 21/823857; H01L 21/823842; H01L 27/092; H01L 29/4975; H01L 29/7842
See application file for complete search history.

(56) References Cited

U.S. PATENT DOCUMENTS

| 2005/0170104 A1* | 8/2005 | Jung | H01L 21/3185 427/569 |
| 2007/0181951 A1* | 8/2007 | Chen | H01L 29/7843 257/374 |
| 2012/0193728 A1* | 8/2012 | Matsuki | H01L 29/517 257/411 |
| 2015/0035073 A1* | 2/2015 | Ando | H01L 29/513 438/783 |

OTHER PUBLICATIONS

Richard W. Johnson, Adam Hultqvist, and Stacey F. Bent; A brief review of atomic layer deposition: from fundamentals to applications; Jun. 2014; Elsevier LTD.; Materials Today, vol. 17, No. 5, pp. 236-246. (Year: 2014).*

* cited by examiner

*Primary Examiner* — Shahed Ahmed
*Assistant Examiner* — Vicki B. Booker
(74) *Attorney, Agent, or Firm* — Alston & Bird LLP

(57) ABSTRACT

A method of forming a strained semiconductor device includes: forming a substrate and a MOS device on the substrate; depositing a molecular plug film structure on the MOS device, The molecular plug film structure includes at least one molecular plug film, depositing a stress film on the molecular plug film structure, and performing an annealing process. The stress applied to the MOS device by the stress film is increased by the annealing process. The structure made by the method includes: a MOS device formed on a substrate, a molecular plug film structure formed on the MOS device, the molecular plug film structure includes at least one molecular plug film, and a stress film formed on the molecular plug film structure.

7 Claims, 3 Drawing Sheets

STRAINED SEMICONDUCTOR DEVICE WITH IMPROVED NBTI AND A METHOD OF MAKING THE SAME

CROSS-REFERENCES TO RELATED APPLICATIONS

This application claims priority to Chinese patent application No. CN 201911163029.0, filed at CNIPA on Nov. 25, 2019, and entitled "A STRAINED SEMICONDUCTOR DEVICE WITH IMPROVED NBTI AND A METHOD OF MAKING THE SAME", the disclosure of which is incorporated herein by reference in entirety.

TECHNICAL FIELD

The present application relates to the technical field of semiconductor device, and in particular, to a strained semiconductor device.

BACKGROUND

In recent years, strained technology has attracted much attention due to outstanding performance of improved performance of the Complementary-Metal-Oxide-Semiconductor (CMOS) devices. Especially for thin film deposition technology in below 90 nm processes, many methods have been introduced to enhance carrier mobilities.

For example, in the related art, for a Positive-Channel-Metal-Oxide-Semiconductor (PMOS) device, a stress film is usually deposited on the substrate surface generating a compressive stress film. A compressive stress is increased by compressing the stress film to improve the hole mobility of the PMOS device. For Negative-Channel-Metal-Oxide-Semiconductor (NMOS) devices, a stress film is deposited on the substrate surface, generating a tensile stress film. The tensile stress is increased by stretching the stress film to increase the electron mobility of the NMOS devices, thereby improving the conductivity performance of the device.

FIG. 2 shows the molecular model of molecules in a stressed film, where dangling bonds from N—H or Si—H molecules are not stable in the process. Referring to FIG. 2, a deposited stress film contains molecules with many dangling Si—H bonds and N—H bonds. The H atoms in these dangling bonds will turn loose at high temperatures in the subsequent annealing process. Furthermore, a single H atom is not stable and easily combines with another one to form molecular $H_2$. The two H atoms might combine and diffuse into the gate-oxide interfacial layer of the semiconductor device, causing Negative Bias Temperature Instability (NBTI) and degrading the performance of of the semiconductor device. Therefore, there is a need to improve the NBTI problem.

BRIEF SUMMARY

The present application provides a strained semiconductor device structure and a method of forming it.

In one aspect, according to some embodiments in this disclosure, a method for improving NBTI of a strained semiconductor device includes the following steps: providing a substrate and forming a metal-oxide-semiconductor (MOS) device on the substrate; forming a molecular plug film structure on the MOS device, wherein the molecular plug film structure includes at least one molecular plug film; depositing a stress film on the molecular plug film structure; and performing an annealing process to apply stress on the MOS device.

In some cases, forming a molecular plug film structure on the MOS device comprises applying an atomic layer deposition (ALD) process.

In some cases, the ALD process is performed at temperature in a range of 300° C. to 700° C.

In some cases, a thickness of the molecular plug film structure ranges from 10 A to 200 A.

In some examples, the molecular plug film comprises at least one of materials including pure silicon nitride (SiN), carbon-doped SiN, and boron-doped SiN.

In some examples, the molecular plug film comprises at least one of materials including pure silicon nitride (SiN), carbon-doped SiN, and boron-doped SiN.

In some cases, depositing a stress film on the molecular plug film structure comprises: a chemical vapor deposition (CVD) process.

In some cases, the stress film comprises at least one of materials including pure SiN, carbon-doped SiN, and boron-doped SiN.

In some cases, the stress film comprises at least one of materials including pure SiN, carbon-doped SiN, and boron-doped SiN.

According to another embodiment of the disclosure, a structure for improving NBTI of a strained semiconductor device, comprising: a substrate and a MOS device formed on the substrate; a molecular plug film structure formed on the MOS device, said molecular plug film structure including at least one molecular plug film; and a stress film formed on the molecular plug film structure.

In some examples, the molecular plug film is deposited on the MOS device by an ALD process at a temperature in a range of 300° C. to 700° C.; and wherein a thickness of the molecular plug film ranges from 10 A to 200 A.

In some other examples, the molecular plug film comprises at least one of materials inducing pure SiN, carbon-doped SiN, and boron-doped SiN.

In some cases, the stress film comprises at least one of materials including pure SiN, carbon-doped SiN, and boron-doped SiN.

For example, the MOS device comprises a gate, a source, a drain, and a gate oxide layer sandwiched between the gate and the substrate, wherein the gate oxide layer extends between the source and the drain.

In some cases, the source and drain each comprises a metal silicide.

In some other cases, the metal silicide comprises NiSi.

The technical solution of the present application includes at least the following advantages: the dangling bonds in the stress film are broken by the annealing process to release H atoms, so that the stress film shrinks to increase the stress exerted by the stress film on a semiconductor device; since the H atoms are unstable, hydrogen gas formed by the combination of two H atoms would diffuse to the gate-oxygen interface of the semiconductor device, the molecular plug film structure under the stress film can function as a molecular plug to block the diffusion of hydrogen molecules, thereby avoiding the negative bias temperature instability of the semiconductor device to improve the NBTI of strained semiconductor devices.

BRIEF DESCRIPTION OF THE DRAWINGS

In order to more clearly illustrate the specific implementations of the present application or the technical solutions in the prior art, the drawings used in the specific implementations or prior art description are briefly introduced below. Obviously, the drawings described below are some implementations of the present application. For those of ordinary skill in the art, other drawings can be obtained based on these drawings without creative work.

REFERENCE NUMERALS

Figure 1:
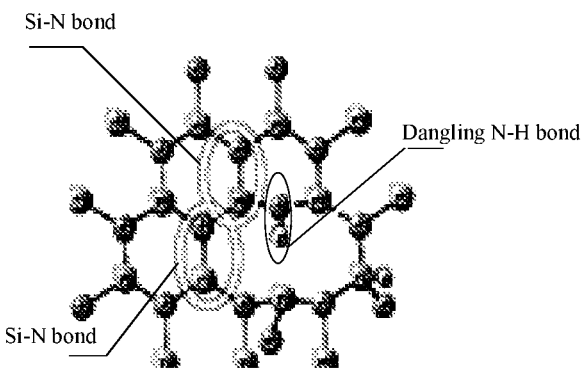
FIG. 1 illustrates a molecular structure in a molecular plug film, according to an embodiment of the disclosure.
Figure 2:
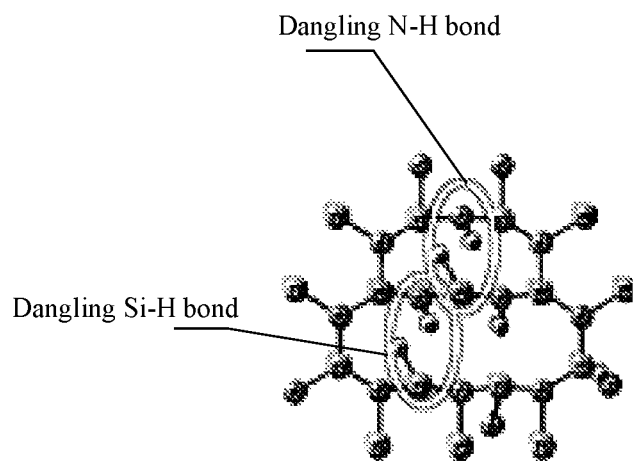
FIG. 2 illustrates another molecular structure in stress film, according to some embodiments of the disclosure.

Substrate, 100;
Gate, 210;
Gate oxide layer, 220;
Source, 230;
Drain, 240;
Molecular plug film structure, 300; and
Stress film, 400.

DETAILED DESCRIPTION

The technical solutions in this application will be clearly and completely described below with references to the drawings. Obviously, the described embodiments are some of the embodiments of the application, but not all of the embodiments. Based on the embodiments in the present application, all other embodiments obtained by those of ordinary skill in the art without creative work shall fall within the protection scope of the present application.

In the description of this application, it should be noted that the orientation or positional relationship indicated by the terms "center", "upper", "lower", "left", "right", "vertical", "horizontal", "inside", "outside", or the like is based on the orientation or positional relationship shown in the drawings, is only for the convenience of describing this application and simplified description, and does not indicate or imply that the indicated device or element must have a specific orientation or be configured and operated in a specific orientation. Therefore, the orientation or positional relationship should not to be construed as limitations on the present application. In addition, the terms "first," "second," and "third" are used for descriptive purposes only, and should not be construed to indicate or imply relative importance.

In the description of this application, it should be noted that the terms "installation", "connected", and "connection" should be understood in a broad sense, unless explicitly stated and defined otherwise, for example, they may be fixed connection or removable connection, or integral connection; can be mechanical or electrical connection; can be direct connection, or indirect connection through an intermediate medium, or the internal communication of two elements, and can be wireless or wired connection. For those of ordinary skill in the art, the specific meanings of the above terms in this application can be understood in specific situations.

In addition, the technical features involved in the different implementations of the present application described below can be combined with each other as long as they do not conflict with each other.

Figure 3:
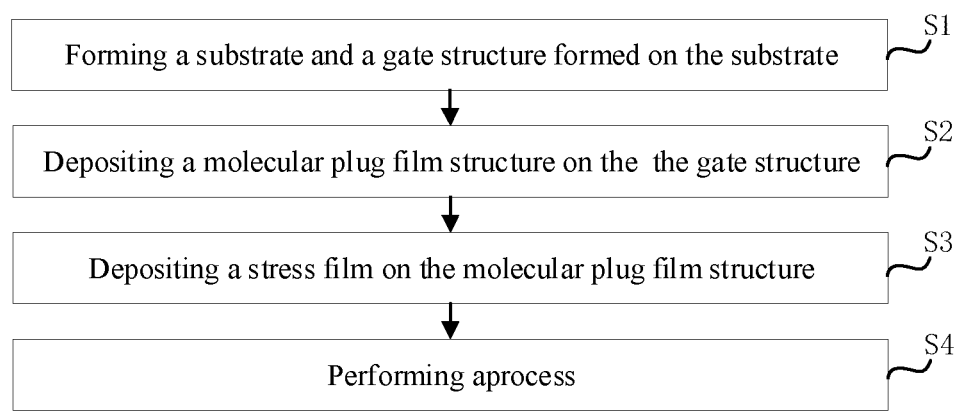
FIG. 3 is a flow chart of the method of making the structure in FIG. 2 and FIG. 3 for improving NBTI of strained semiconductor device in accordance with some embodiments.
Figure 6:
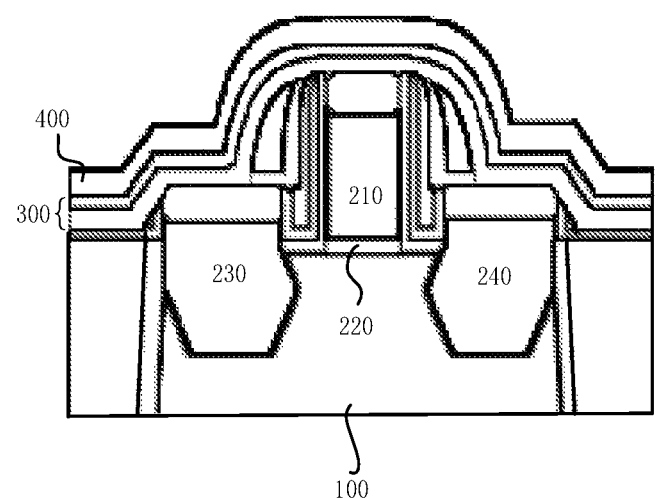
FIG. 6 illustrates a structure with improved NBTI of a strained semiconductor device.

Referring to FIGS. 3, and 6, a first aspect of the present disclosure, a method for improving NBTI of a strained semiconductor device, includes the steps described in the following text.

Figure 5:
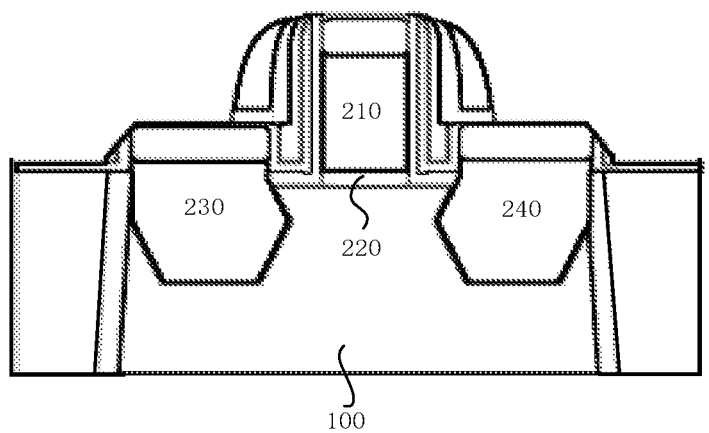
FIG. 5 illustrates a MOS gate structure formed after the step of S1 in FIG. 3.

S1: referring to FIG. 5, providing a substrate 100 and a gate structure on the substrate 100;

S2: depositing a molecular plug film structure 300 on gate structure and the molecular plug film structure 300 includes at least one molecular plug film;

S3: depositing a stress film 400 on the molecular plug film structure 300; and

S4: performing an annealing process, wherein the stress applied to the gate structure by the stress film 400 is increased by the annealing process.

Through the annealing process, the dangling bonds having H atoms in the stress film 400 are broken H atoms are released, so that the stress film 400 shrinks to increase the stress exerted by the stress film 400 on the gate structure. The instability of the H atoms combine to form $H_2$—the hydrogen gas generated by the combining two H atoms will diffuse into the gate-oxide interface. The molecular plug film structure 300 located under the stress film 400 functions as a molecular plug to block the diffusion of the hydrogen molecules, thereby avoiding the effect of negative bias temperature instability (NBTI) of the strained semiconductor device.

Annealing process can be achieved with a few techniques. For example, an UV (Ultra Violet) laser can be used to perform the annealing process in S4, the surface of the stress film 400 is irradiated with the UV laser beam from the UV laser, and the dangling bonds in the stress film 400 are broken by the laser heating effects. Thus, free H atoms are formed, and the stress film 400 shrinks.

In S2, a molecular plug film structure 300 is deposited on the gate structure on a semiconductor device by an Atomic Layer Deposition (ALD) process. There is at least one molecular plug film 300.

Figure 4:
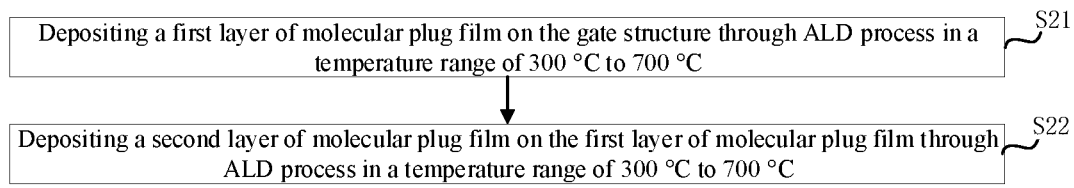
FIG. 4 illustrates a method of depositing a molecular plug film structure on the device in accordance with some embodiments.

In some cases, described in FIG. 4, the deposited molecular plug film structure 300 includes two molecular plug films. Then the steps for depositing the two-layer molecular plug film structure 300 on the gate structure includes:

S21: depositing a first molecular plug film on the gate structure through an ALD process in a temperature range of 300° C. to 700° C.; and S22: depositing a second layer of molecular plug film on the first layer of molecular plug film through an ALD process in a temperature range of 300° C. to 700° C.

S21 to S22 describe that if the deposited molecular plug film structure 300 includes two molecular plug films, that is, on the basis of the previous molecular plug film, a further film of molecular plug was deposited by the same way.

Because the molecular plug film 300 produced by the ALD process gets accurate thickness control and high stability, it is less sensitive to changes in temperature and reaction flux. In addition, the ALD film has both high purity and high density, and achieves excellent step coverage even for a gate structure at an aspect ratio of up to 100:1. Therefore, the molecular plug film is used as a diffusion barrier layer when being deposited under the stress film 400 to achieve the effect of molecular plugging. In addition, when a plurality of molecular plug films are deposited through the ALD process, the chemical reaction of the later molecular plug film is directly related to the previous molecular plug film, thereby improving the molecular plug function of the molecular plug film structure 300.

The thickness of each of the molecular plug films ranges from 10 A to 200 A.

The molecular plug film includes typically one of the materials: pure SiN, carbon-doped SiN, and boron-doped SiN.

Herein, the pure SiN refers to SiN containing more than 90% SiN. FIG. 1 shows the molecular structure of a SiN molecular plug film layer, which can be deposited through an ALD process in a temperature range of 300° C. to 700° C. It is expected to have the deposited SiN molecular plug film layer has high chemical bond saturation and few dangling bonds through the ALD process in the temperature range of 300° C. to 700° C., so that the molecular plug film function as a better molecular plug, thus can prevent the diffusion of hydrogen molecules to the gate-oxygen interface in the subsequent annealing process, such that the lifetime of the semiconductor device NBTI is significantly improved.

For S3, depositing the stress film 400 on the molecular plug film structure 300 includes: depositing the stress film 400 on the molecular plug film structure 300 through a Chemical Vapor Deposition (CVD) process.

The stress film 400 includes one of the materials: pure SiN, carbon-doped SiN, and boron-doped SiN, here pure SiN refers SiN of more than 90% purity.

As a second embodiment of the present disclosure, a structure of a low NBTI strained semiconductor device is provided. FIG. 6 shows the structures includes a substrate 100 and MOS structure formed on the substrate 100, a molecular plug film structure 300 formed on the MOS structure, the molecular plug film structure 300 includes at least one molecular plug film and a stress film 400 formed on the molecular plug film structure 300.

The dangling bonds in the stress film 400 will be broken loose in the subsequent annealing process and H atoms are released. As a result, the stress film 400 shrinks to increase the stress it applies to the MOS structure. Due to the instability of H atoms, hydrogen gas generated by combining two H atoms diffuses through the gate-oxide interface of the MOS structure. The molecular plug film structure 300 located under the stress film 400 functions as a molecular plug to block the diffusion of hydrogen molecules, thereby avoiding NBTI of strained semiconductor devices.

The molecular plug film is deposited on the gate structure through an ALD process in a temperature range of 300° C. to 700° C.; and the thickness of the molecular plug film ranges from 10 A to 200 A.

Because the molecular plug film produced by the ALD process has inherently thickness control performance and high stability, is less sensitive to changes in temperature and reaction flux, has both high purity and high density, is even and has a high shape-preserving property, and can achieve excellent step coverage even for a structure with an aspect ratio of up to 100:1, the molecular plug film can be used as a diffusion barrier layer when being deposited under the stress film 400 to achieve the effect of molecular plugs. In addition, when a plurality of molecular plug films are deposited through the ALD process, the chemical reaction of the new molecular plug film is directly related to the previous molecular plug film, thereby improving the molecular plug function of the molecular plug film structure 300.

The molecular plug film includes at least one material of pure SiN, carbon-doped SiN, and boron-doped SiN. The stress film 400 includes one of the materials: pure SiN, carbon-doped SiN, and boron-doped SiN, here pure SiN refers to more than 90% SiN.

The MOS structure includes a gate 210, a gate oxide layer 220 located between the gate 210 and the substrate 100, and a source 230 and a drain 240 located on two sides of the gate oxide layer 220. The source 230 and the drain 240 include metal silicide, and the metal silicide includes NiSi.

Figure 7:
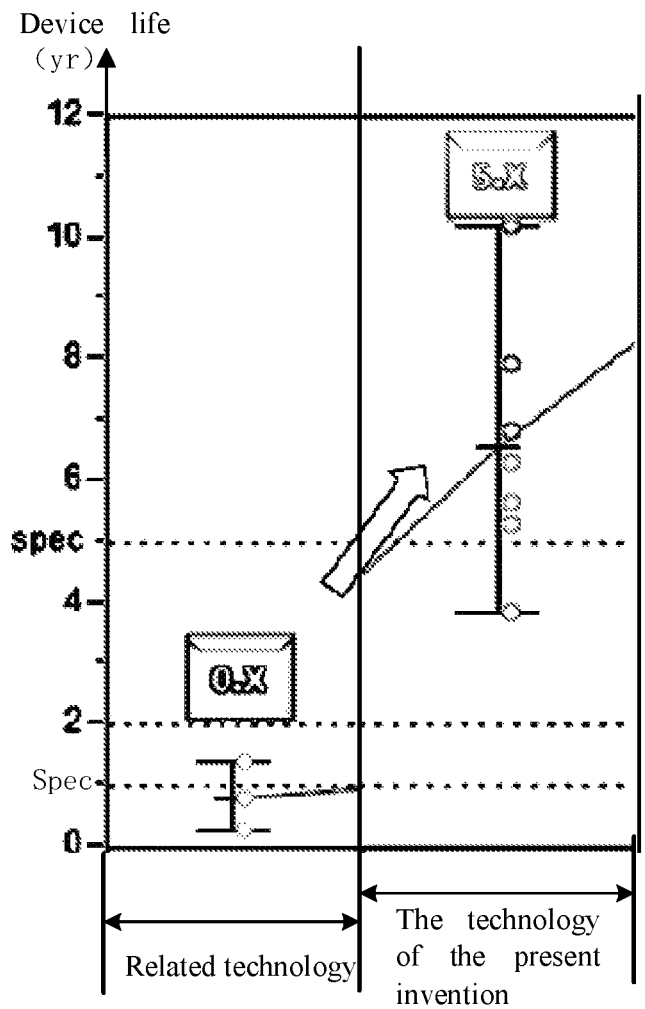
FIG. 7 shows NBTI lifetime improvement data.

FIG. 7 shows NBTI lifetime improvement data taken from lower power PMOS devices in 28 nm process manufactured with a current process (at the left side), and the experimental PMOS having improved NBTI as disclosed above. The requirement for the life of NBTI for the 28 nm process is 0. X year, where X is a natural number. The requirement for the life of NBTI of PMOS is 5.X years. The present disclosure has greatly improved the life of the NBTI of the MSO transistor. and therefore, it can be seen.

Obviously, the foregoing embodiments are merely for clear description of made examples, and are not limitations on the implementations. For those of ordinary skill in the art, other different forms of changes or modifications can be made on the basis of the above description. There is no need and cannot be exhaustive for all implementations. And, the obvious changes or modifications introduced thereby are still within the protection scope of this application.

What is claimed is:

1. A method for improving negative bias temperature instability (NBTI) of a strained semiconductor device, comprising following steps:
   providing a substrate and forming a metal-oxide-semiconductor (MOS) device on the substrate;
   forming a molecular plug film structure on the MOS device, wherein the molecular plug film structure includes a first molecular plug film on the MOS device and a second molecular plug film on the first molecular plug film, wherein one of the first molecular plug film and the second molecular plug film comprises SiN;
   depositing a stress film directly on a top surface of the molecular plug film structure; and
   performing an annealing process to apply stress on the MOS device.

2. The method for improving NBTI of the strained semiconductor device according to claim 1, wherein forming the molecular plug film structure on the MOS device comprises applying an atomic layer deposition (ALD) process.

3. The method for improving NBTI of the strained semiconductor device according to claim 2, wherein the ALD process is performed at temperature in a range of 300° C. to 700° C.

4. The method for improving NBTI of the strained semiconductor device according to claim 1, wherein a thickness of the molecular plug film structure ranges from 10 A to 200 A.

5. The method for improving NBTI of the strained semiconductor device according to claim 2, wherein the molecular plug film structure comprises at least one of materials including pure silicon nitride (SiN), carbon-doped SiN, and boron-doped SiN.

6. The method for improving NBTI of the strained semiconductor device according to claim 1, wherein depositing the stress film on the molecular plug film structure comprises:
   a chemical vapor deposition (CVD) process.

7. The method for improving NBTI of the strained semiconductor device according to claim 1, wherein the stress film comprises at least one of materials including pure SiN, carbon-doped SiN, and boron-doped SiN.

* * * * *